(12) United States Patent
Yamakawa et al.

(10) Patent No.: US 8,547,183 B2
(45) Date of Patent: *Oct. 1, 2013

(54) VOLTAGE CONTROLLED OSCILLATOR

(75) Inventors: Junichiro Yamakawa, Sayama (JP); Kazuo Akaike, Sayama (JP); Mikio Takano, Sayama (JP); Hiroshi Hoshigami, Sayama (JP); Kenji Kawahata, Sayama (JP); Kietsu Saito, Sayama (JP); Yasushi Yamamoto, Sayama (JP); Tatsunori Onzuka, Sayama (JP); Toshimasa Tsuda, Sayama (JP); Susumu Yoshimoto, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/924,515

(22) Filed: Sep. 29, 2010

(65) Prior Publication Data
US 2011/0080223 A1 Apr. 7, 2011

(30) Foreign Application Priority Data
Oct. 5, 2009 (JP) .................. 2009-231983

(51) Int. Cl.
*H03B 5/08* (2006.01)
(52) U.S. Cl.
USPC .............. 331/167; 331/117 R; 331/117 FE; 331/177 V
(58) Field of Classification Search
USPC ............... 331/177 V, 167, 117 FE, 117 R
See application file for complete search history.

(56) References Cited

U.S. PATENT DOCUMENTS

| 5,532,651 A | 7/1996 | Jager et al. |
| 5,600,279 A | 2/1997 | Mori |
| 6,018,282 A | 1/2000 | Tsuda |

(Continued)

FOREIGN PATENT DOCUMENTS

| GB | 1 287 209 | 8/1972 |
| JP | 58-012315 | 1/1983 |

(Continued)

OTHER PUBLICATIONS

U.S. Appl. No. 12/924,417, Tsuda et al., filed Sep. 27, 2010.

(Continued)

*Primary Examiner* — Arnold Kinkead
(74) *Attorney, Agent, or Firm* — Jordan and Hamburg LLP

(57) ABSTRACT

There is provided a voltage controlled oscillator that is compact and can be manufactured at low cost. The voltage controlled oscillator is structured to include: a resonance part including a variable capacitance element and an inductance element, the variable capacitance element having a capacitance that varies according to a control voltage for frequency control input from an external part, and a series resonant frequency of the resonance part being adjusted according to the capacitance; an amplifying part amplifying a frequency signal from the resonance part; and a feedback part including a capacitance element for feedback and feeding the frequency signal amplified by the amplifying part back to the resonance part to form an oscillation loop together with the amplifying part and the resonance part, wherein the amplifying part is provided in an integrated circuit chip, and the resonance part and the capacitance element for feedback are formed as circuit components separate from the integrated circuit chip. The circuit components are selected according to an oscillation frequency.

14 Claims, 18 Drawing Sheets

(56) References Cited

U.S. PATENT DOCUMENTS

| | | | |
|---|---|---|---|
| 6,046,647 A | 4/2000 | Nelson | |
| 6,072,371 A | 6/2000 | Kobayashi et al. | |
| 6,606,006 B1 * | 8/2003 | Alexandersson | 331/108 C |
| 6,949,811 B2 | 9/2005 | Miyazawa | |
| 7,746,232 B2 | 6/2010 | Hashimoto | |
| 2003/0183864 A1 | 10/2003 | Miyazawa | |
| 2007/0205956 A1 | 9/2007 | Hashimoto | |
| 2010/0219927 A1 | 9/2010 | Hashimoto | |

FOREIGN PATENT DOCUMENTS

| | | |
|---|---|---|
| JP | 62-162317 | 7/1987 |
| JP | 4-361407 | 12/1992 |
| JP | 7-131243 | 5/1995 |
| JP | 8-079069 | 3/1996 |
| JP | 10-209714 | 8/1998 |
| JP | 10-215119 | 8/1998 |
| JP | 2000-183647 | 6/2000 |
| JP | 2000-312115 | 11/2000 |
| JP | 2001-223529 | 8/2001 |
| JP | 2001-339240 | 12/2001 |
| JP | 2003-297927 | 10/2003 |
| JP | 2005-072154 | 3/2005 |
| JP | 2007-036822 | 2/2007 |
| JP | 2007-201772 | 8/2007 |
| JP | 2007-235034 | 9/2007 |

OTHER PUBLICATIONS

U.S. Appl. No. 12/924,468, Onzuka et al., filed Sep. 28, 2010.

U.S. Appl. No. 12/924,467, Yamakawa et al., filed Sep. 28, 2010.

Peter Thoma: "Absolute calorimetric determination of dielectric loss factors at 2=10 4 s−1 and 4.2 k and application to the measurement of loss factors of standard capacitors at room temperature", IEEE Transactions on Instrumentation and Measurement, IEEE Service Center, Piscataway, NJ, US, vol. 15, No. 4, Dec. 1, 1980, pp. 328-330, XP011246154, ISSN: 0018-9456.

\* cited by examiner (a)

(b)

(a)

(b)

(a)

(b)

(a)

(b)

(c)

(a)

(b)

(c)

(a)

(b)

(c)

(a)

(b)

(c)

(a)

(b)

(c)

(a)

(b)

(a)

(b)

(a)

(b)

VOLTAGE CONTROLLED OSCILLATOR

BACKGROUND OF THE INVENTION

1. Field of the Invention

The present invention relates to a voltage controlled oscillator.

2. Description of the Related Art

As various kinds of electronic devices have come to be more compact, the downsizing of a voltage controlled oscillator (VCO) mounted in these electronic devices has also been under consideration. For the downsizing of an electronic circuit, it is effective to form components composing the circuit on one chip in an integrated manner, and therefore, forming circuit components composing the VCO on one chip is also a conceivable method also for the VCO.

The structure of the VCO will be described in detail in an embodiment and here a brief description thereof will be given. The VCO includes an inductance element and a capacitor being a capacitance element both of which form a series resonance circuit, and an oscillation frequency of the VCO is decided by a resonance point of the series resonance circuit. The VCO further includes a varicap diode being a variable capacitance element for shifting the resonance point of the resonance circuit. On a subsequent stage of a resonance part including these inductance element, capacitance element, and variable capacitance element, there is provided a transistor serving as an amplifying part and a feedback part including a feedback capacitance element, the amplifying part and the feedback part forming an oscillation loop together with the resonance part. These resonance part, transistor, and feedback capacitance element form the oscillation loop. Incidentally, at the time of the oscillation, the resonance part is inductive in order to generate a negative resistance −Rv to cause the oscillation.

The circuit elements of the resonance part and the feedback part need to be designed according to an oscillation frequency of the VCO, and if a VCO whose circuit elements are all formed as one chip is to be manufactured, it is necessary to make a specialized mask for each type (oscillation frequency) of the VCO, which leads to an increase in manufacturing cost including development cost.

A patent document 1 describes a VCO in which a passive resonator is formed on a substrate separate from an integrated circuit. However, the patent document 1 does not take up the aforesaid problem, and in the disclosed VCO, capacitors C1, C2 being feedback capacitance elements are included in an IC chip, and thus the aforesaid problem is not solved sufficiently.

The following problem also arises when the oscillation frequency becomes high. Specifically, when the frequency becomes high, for example, several GHz or ten several GHz, variable capacitance elements become inductive, and a bonding wire used for the connection of the variable capacitance elements also becomes inductive, and as a result, a variable width (span of adjustable range) of the frequency becomes narrower than a design value or no oscillation occurs. This implies that the manufacture of a VCO in a high frequency band is difficult.

[Patent document 1] Japanese Patent Application Laid-open No. 2000-183647 (FIG. 2 and so on)

SUMMARY OF THE INVENTION

The present invention was made under such circumstances and has an object to provide a voltage controlled oscillator that is compact and can be manufactured at low cost.

A voltage controlled oscillator of the present invention includes:

a resonance part including a variable capacitance element and an inductance element, the variable capacitance element having a capacitance that varies according to a control voltage for frequency control input from an external part, and a series resonant frequency of the resonance part being adjusted according to the capacitance;

an amplifying part amplifying a frequency signal from the resonance part; and a feedback part including a capacitance element for feedback, and feeding the frequency signal amplified by the amplifying part back to the resonance part to form an oscillation loop together with the amplifying part and the resonance part, wherein the amplifying part is provided in an integrated circuit chip, and the resonance part and the capacitance element for feedback are formed as circuit components separate from the integrated circuit chip, and wherein the integrated circuit chip and the circuit components are mounted on a substrate.

The inductance element of the resonance part is, for example, a conductive path formed on a quartz-crystal substrate. For example, in the resonance part, a capacitance element for compensation may be connected in series to the variable capacitance element in order to compensate for an inductive property of the variable capacitance element caused by a high frequency to make the variable capacitance element capacitive when seen from the inductance element, and the capacitance element for compensation is made up of, for example, a pair of comb-like conductive paths whose teeth are alternately arranged at a spaced interval. The series resonant frequency is, for example, 5 GHz or more.

Further, a voltage controlled oscillator of another invention includes: a resonance part including a variable capacitance element and an inductance element, the variable capacitance element having a capacitance that varies according to a control voltage for frequency control input from an external part, and a series resonant frequency of the resonance part being adjusted according to the capacitance;

an amplifying part amplifying a frequency signal from the resonance part; and a feedback part including a capacitance element for feedback and feeding the frequency signal amplified by the amplifying part back to the resonance part to form an oscillation loop together with the amplifying part and the resonance part, wherein in the resonance part, a capacitance element for compensation is connected in series to the variable capacitance element in order to compensate for an inductive property of the variable capacitance element caused by a high frequency to make the variable capacitance element capacitive when seen from the inductance element. The inductance element of the resonance part is, for example, a conductive path formed on a quartz-crystal substrate. The capacitance element for compensation is made up of, for example, a pair of comb-like conductive paths whose teeth are alternately arranged at a spaced interval.

In the present invention, the resonance part and the feedback part form the oscillation loop, the amplifying part for amplifying the frequency signal from the resonance part is provided in the integrated circuit chip, the resonance part and the capacitance element for feedback are formed as the circuit components separate from the integrated circuit chip. Since the amplifying part is provided in the integrated circuit chip, the downsizing is achieved, and since the circuit components of the resonance part and the capacitance element for feedback can be selectively mounted on the substrate according to the oscillation frequency, there is no need to prepare masks each having a circuit pattern drawn for each oscillation frequency. Therefore, it is possible to downsize the voltage controlled oscillator and manufacture the voltage controlled oscillator at low cost.

DETAILED DESCRIPTION OF THE PREFERRED EMBODIMENT

Figure 1:
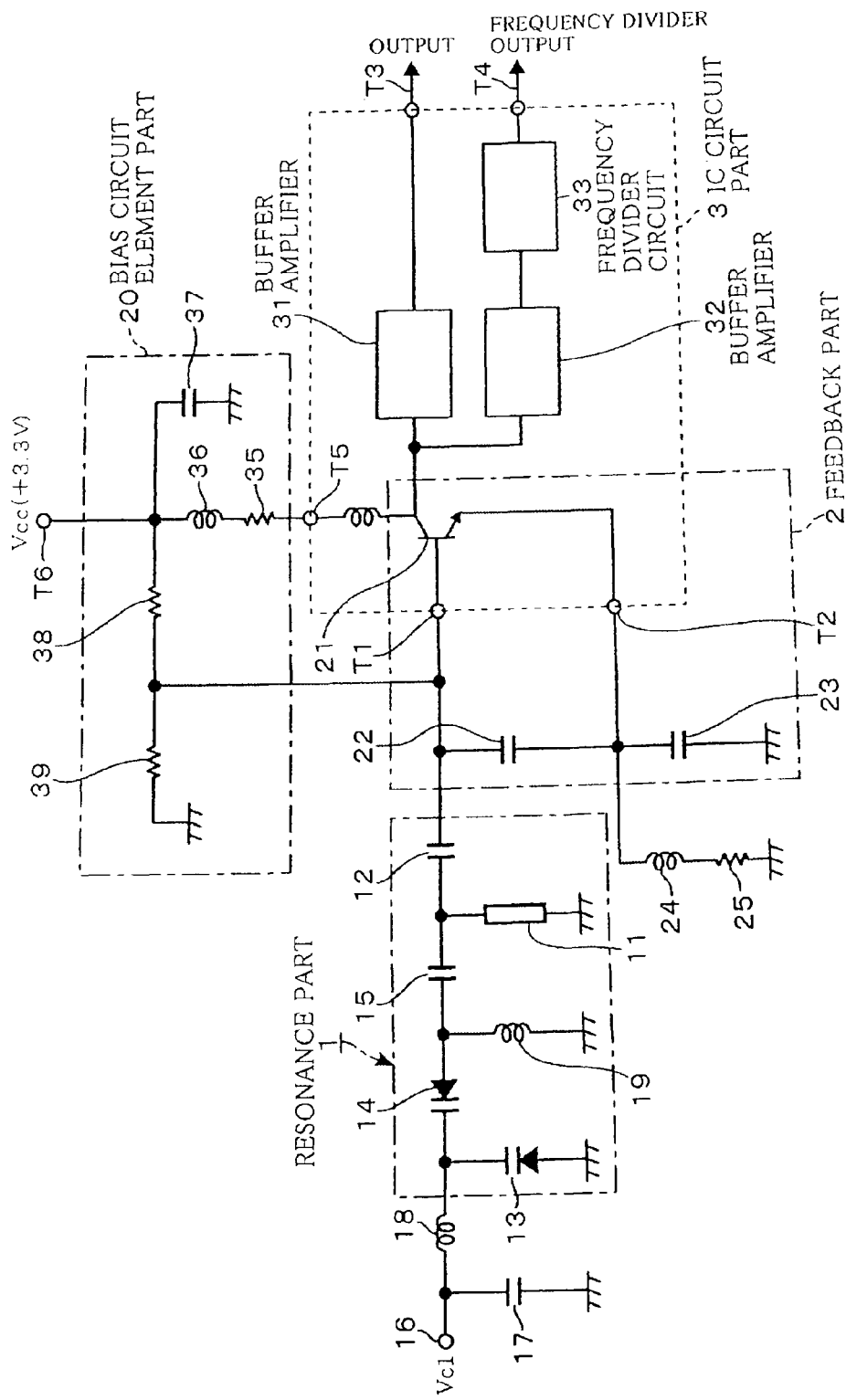
FIG. 1 is a circuit diagram of a voltage controlled oscillator according to the present invention.

Regarding an embodiment of a voltage controlled oscillator of the present invention, its circuitry will be described with reference to FIG. 1 before its structure is described. In FIG. 1, a resonance part 1 includes a series circuit for series resonance made up of an inductance element 11, which is formed of a conductive line as will be described later, and a capacitor 12 being a capacitance element. A series circuit made up of a first varicap diode 13, a second varicap diode 14, and a capacitor 15 being a capacitance element is connected in parallel to the inductance element 11 to form a parallel circuit for parallel resonance. That is, this resonance part 1 has a series resonant frequency (resonance point) of the series circuit and a parallel resonant frequency (antiresonance point) of the parallel circuit, and its oscillation frequency is determined by the frequency of the resonance point. In this example, constants of the respective circuit elements are set so that the resonance point becomes larger than the antiresonance point, and providing such an antiresonance point causes a frequency characteristic near the resonance point to be steep.

Further, in FIG. 1, capacitance values of the first varicap diode 13 and the second varicap diode 14 are adjusted by a control voltage supplied to an input terminal 16 for control voltage, so that the antiresonance point of the parallel circuit moves and as a result the resonance point also moves, whereby the oscillation frequency is adjusted. The reason why the second varicap diode 14 is used in addition to the first varicap diode 13 is to increase a span of adjustment range of the frequency. A capacitor 17 is a capacitor for voltage stabilization, and inductors 18, 19 are inductors for bias.

Further, on a subsequent stage of the resonance part 1, a feedback part 2 is provided, and the feedback part 2 includes: an NPN transistor 21 serving as an amplifying part whose base is connected to the capacitor 12; and a series circuit of capacitors 22, 23 serving as feedback capacitance elements, the series circuit being connected between a connection point of the capacitor 12 and the base of the transistor 21 and a ground. An emitter of the transistor 21 is connected to a connection point between the capacitors 22, 23 and is grounded via an inductance 24 and a resistor 25. The transistor 21 is provided in a chip of an IC circuit part (LSI) 3 shown by the dotted line, and the base and emitter of the transistor 21 are connected to both ends of the capacitor 22 via terminal parts (electrodes) T1, T2 of the chip respectively. When the control voltage is externally input to the input terminal 16, such a circuit oscillates at a frequency of the resonance point, for example, at 10 GHz by an oscillation loop made up of the resonance part 1 and the feedback part 2.

In the IC circuit part 3, there are provided, for example, two buffer amplifiers 31, 32 connected in parallel to each other to a collector of the transistor 21, and an oscillation output (signal of the oscillation frequency) is taken out from the buffer amplifier 31 via a terminal part T3, and the oscillation output is taken out from the other buffer amplifier 32 via a frequency divider circuit 33 and a terminal part T4.

Further, the collector of the transistor 21 is connected to a terminal part T5 of the IC circuit part 3 via an inductor 34. Via a resistor 35 and an inductor 36 which are connected in series, the terminal part T5 is connected to a terminal part T6 to which a +3.3V power supply voltage is applied. Further, a capacitor 37 and a resistor 38 are connected to the terminal part T6 in parallel to the resistor 35 and the inductor 36. The capacitor 37 is grounded, and a grounded resistor 39 is connected to the resistor 38 in series. A midpoint of the resistors 38, 39 is connected to a midpoint of the terminal part T1 and the capacitor 22. These capacitor 37, inductor 36, resistors 35, 38, 39 form a bias circuit element part 20 for supplying a bias voltage to the transistor 21.

Figure 2:
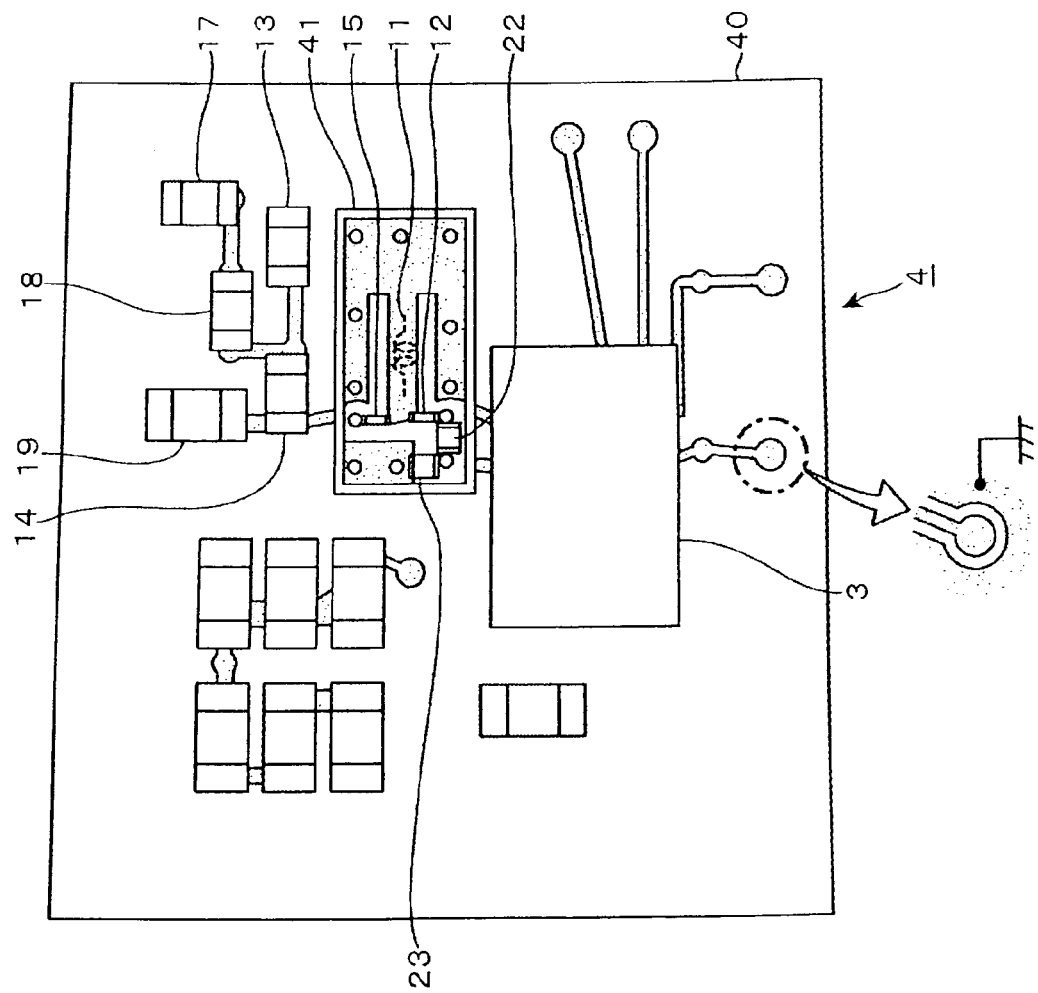
FIG. 2 is a plane view of the voltage controlled oscillator.

FIG. 2 shows a structure example of the VCO shown in the circuit diagram in FIG. 1. In FIG. 2, the VCO 4 is structured such that the chip of the IC circuit part 3, various circuit elements, and a later-described substrate 41 made of quartz crystal are mounted on a dielectric substrate, for example, a ceramics substrate 40, in a square shape. One side of the substrate 40 is, for example, 5.00 mm. The various circuit elements are denoted by the same reference numerals as those in FIG. 1, but reference numerals of the circuit elements forming the bias circuit element part 20 are omitted in FIG. 2. Further, conductive paths of the ceramics substrate 40 and conductive paths of the quartz-crystal substrate 41 are shown by many dots. Incidentally, a surface of the ceramics substrate 40 is actually formed as coplanar lines in which grounded conductors are formed around the conductive paths, but the grounded conductors are not shown to avoid the complication of the drawing, and the actual surface structure of only a portion surrounded by the dotted line in FIG. 2 is shown at the tip of the arrow. These conductive paths and grounded conductors are formed in such manner that unnecessary portions of a film being a conductor formed on the whole ceramics substrate 40 are removed by etching or the like.

Next, the quartz-crystal substrate 41 will be described. The inductance element 11 in FIG. 1 is formed of a conductive line provided on the quartz-crystal substrate 41. Further, the capacitors 12, 15, 22, 23 are formed on the quartz-crystal substrate 41. The quartz-crystal substrate 41 is AT-cut, and its dielectric constants is about 4.0, and loss of electric energy (dielectric loss tangent: tan δ) is about 0.00008. Therefore, a Q value of the quartz-crystal substrate 41 is about 12500 (=1/0.00008). Since the quartz-crystal substrate 41 thus has a high Q value, phase noise is reduced to extremely low over a wide frequency adjustment band. That is, a frequency variable width in which a good phase noise characteristic is obtained is wide.

Figure 3:
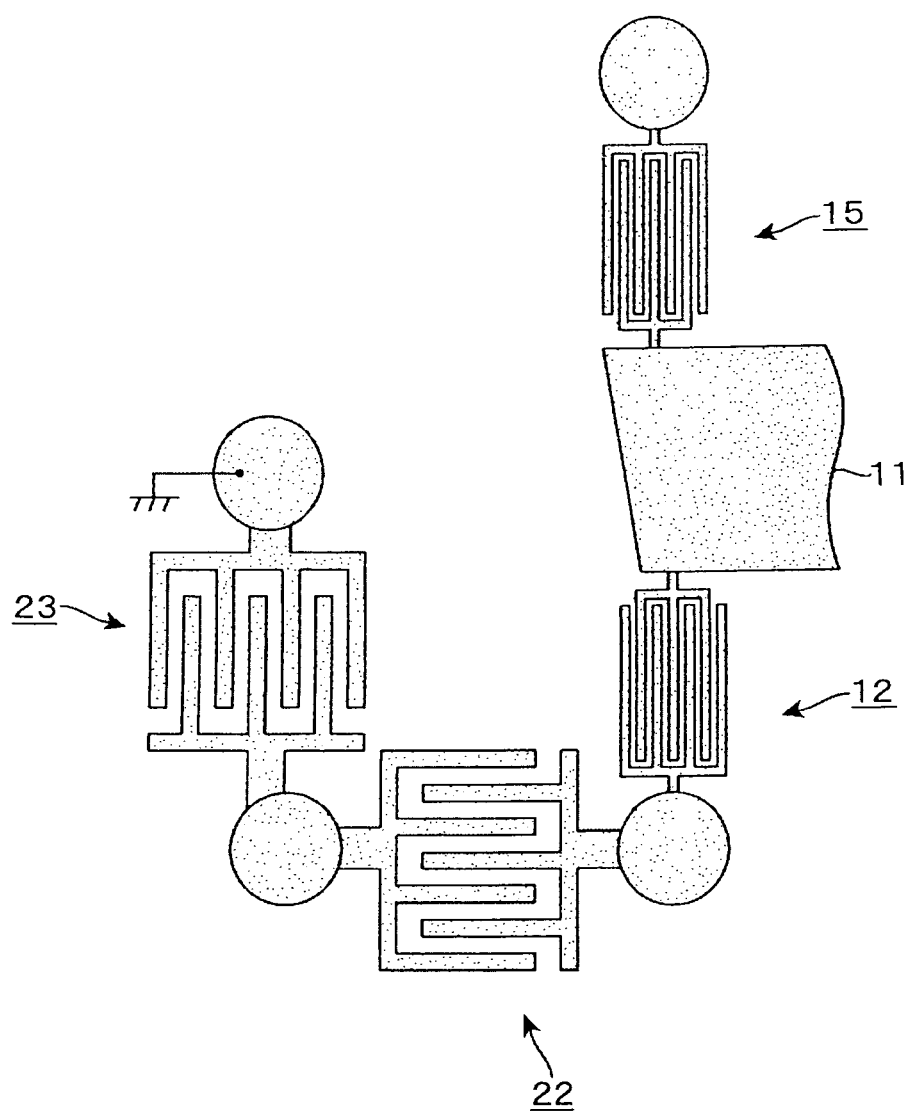
FIG. 3 is a plane view showing an electrode structure of a capacitor of the voltage controlled oscillator.

FIG. 2 shows a state where these capacitors 12, 15, 22, 23 are covered by an outer housing, but FIG. 3 shows a state in which the outer housing is detached from the capacitors. As shown in FIG. 3, the capacitors are each made up of conductive path patterns in a comb-like shape whose teeth are alternately arranged at a spaced interval.

Thus forming the capacitors as the comb-like conductive patterns has the following advantage. In both electrodes forming the capacitor, opposed areas thereof (length dimension of opposed electrode portions) can be made large, which makes it possible to obtain a capacitance element that is compact yet has low loss and whose capacitance value can be set with a high degree of freedom, and that is not likely to be inductive even if the frequency is high. Therefore, this is suitable for a VCO that needs to output a high frequency and needs to be compact.

Figure 4:
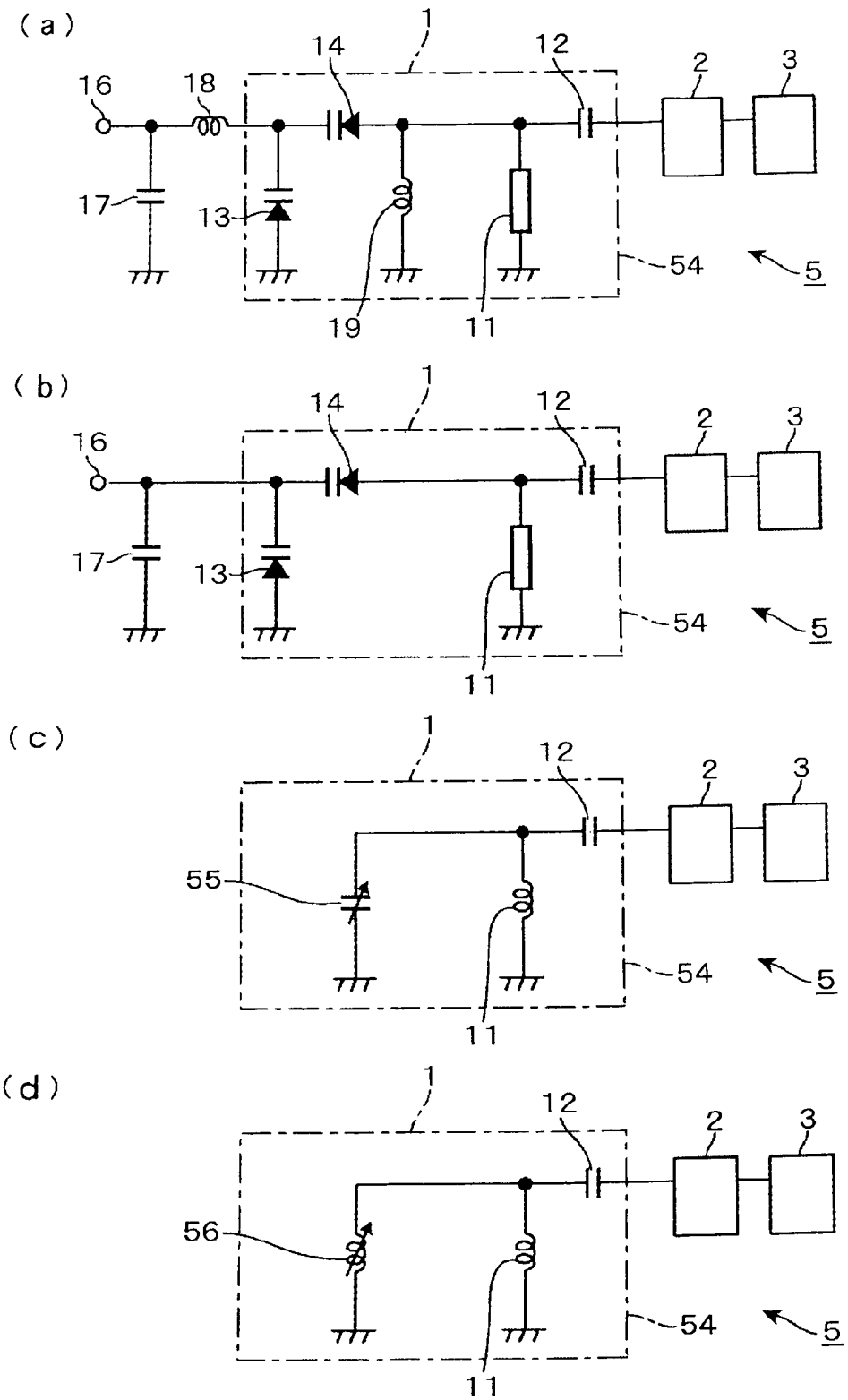
FIG. 4(a) to FIG. 4(d) are explanatory diagrams of an equivalent circuit of a resonance part of the voltage controlled oscillator.

Incidentally, the capacitor 15 is provided to form the parallel circuit for parallel resonance together with the resonant element 11 for inductance, and the role of this capacitor 15 will be described in more detail with reference to FIG. 4(a) to FIG. 4(d). FIG. 4(a) shows a VCO 5 including a resonance part 54, and the resonance part 54 is structured in the same manner as the resonance part 1 of the aforesaid VCO 4 except that the capacitor 15 is not provided. In the VCO 5, a subsequent stage of the resonance part 54 has the same circuitry as that in FIG. 1. If the VCO 5 is structured to output a high frequency and the high frequency flows in circuits forming the VCO 5, the inductors 18, 19 are not seen from the high frequency as shown in FIG. 4(b). Therefore, in this case, an equivalent circuit of the resonance part 54 becomes a circuit shown in FIG. 4(c), and a variable capacitance capacitor 55 in FIG. 4(c) corresponds to the varicap diodes 13, 14.

Here, in the VCO of the present invention, since the circuit elements of the resonance part 1 whose circuit constants have to be set according to the oscillation frequency are not integrated as described above, the varicap diodes 13, 14 forming the resonance part 54 are each structured such that, for example, two chips 51, 52 are connected to each other by a bonding wire 53. FIG. 5(a) and FIG. 5(b) show a horizontal plane view and a vertical sectional view of the varicap diode 13(14) respectively.

Assuming a case where a band of the output frequency from the VCO 5 is made further higher and a frequency in a microwave band is intended to be output, the bonding wire 53 is seen as an inductance component when seen from a microwave flowing in the circuit. That is, an inductance value of the bonding wire 53 becomes large. As a result, the varicap diodes 13, 14 become inductive, and by the coupling of the inductive properties of the varicap diodes 13, 14, there is produced a circuit in which a variable inductor 56 is connected in parallel to the inductance element 11 as shown in FIG. 4(d). Therefore, a parallel resonant frequency designed between the varicap diodes 13, 14 and the inductance element 11 cannot be obtained or parallel resonance does not occur, and as a result, the scope of adjustable range of the oscillation frequency becomes narrower than a design value or no oscillation occurs.

Figure 6:
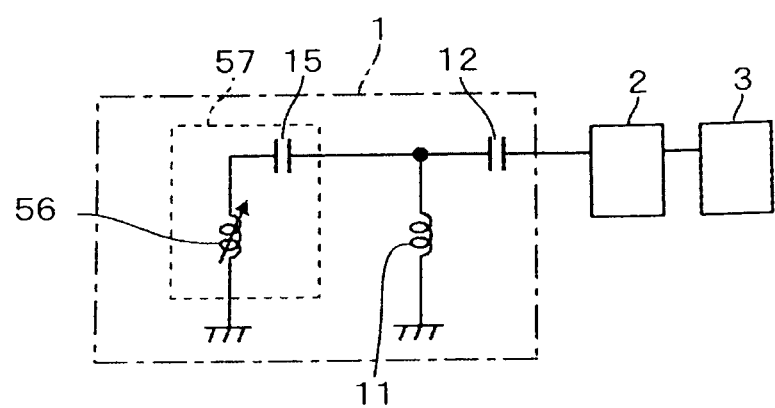
FIG. 6 is a circuit diagram showing an equivalent circuit of a resonance part in FIG. 1.

Therefore, in this embodiment, in order to compensate for the inductive properties of the varicap diodes 13, 14, the capacitor 15 being a capacitance element for compensation is connected in series to the varicap diodes 13, 14 and in parallel to the inductance element 11. FIG. 6 shows an equivalent circuit of the resonance part 1 in FIG. 1, and by ensuring a capacitive property of a portion surrounded by a dotted line 57 in FIG. 6, in which the capacitor 15 and the variable inductor 56 are connected in series, it is possible to cause parallel resonance with the inductance element 11, and as a result, it is possible to adjust the resonance point of the resonance part 1. Concretely, in order to ensure the capacitive property of the series connection portion 57, a capacitance value of the capacitor 15 is set so as to satisfy the condition of Xc>X1, if a reactance of the variable inductor 56 is +jX1 (jwL: L is an inductance value of the variable inductor 56) and a reactance of the capacitor 15 is −jXc (1/jwc: c is a capacitance value of the capacitor 15).

According to the VCO of this embodiment, the circuit elements of the resonance part 1 and the capacitors 22, 23 of the feedback part 2 which need to be selected according to the oscillation frequency of the VCO are not integrated but are disposed as individual components on the quartz-crystal substrate 41 and the ceramics substrate 40, while the transistor 21 forming the feedback part 2 and the circuit elements on a subsequent stage of the transistor 21 are integrated to be formed as the one-chip IC circuit part 3. Therefore, the IC circuit part 3 is made compact, and on the other hand, the circuit components not included in the IC circuit part 3 can be selectively mounted on the substrates 40, 41 according to the oscillation frequency of the VCO, which eliminates a need for preparing IC chips for different oscillation frequencies. As a result, the low-cost manufacture of a compact VCO is enabled.

Further, by connecting the capacitor 15 in series to the varicap diodes 13, 14, it is possible to cause the parallel resonance between the inductance element 11 and the capacitor 15 even when the frequency is in the microwave band, which allows the VCO to oscillate a signal with an extremely high frequency of 10 GHz in the microwave band as described above. Further, forming the electrodes of the capacitors 12, 15, 22, 23 in a comb-like shape can prevent an increase in size of the VCO.

In the above-described example, the two varicap diodes are provided but only a single varicap diode may be provided. Further, when bonding wires are used to connect the varicap diodes to electrodes of the substrate or when the varicap diodes 13, 14 are connected by a bonding wire, the capacitance element is provided so as to compensate for the inductive properties of the varicap diodes themselves and the inductive property of the bonding wire. In such a case, the inductive properties of the varicap diodes 13, 14 mean both the inductive properties of the varicap diodes 13, 14 themselves and the inductive property of the bonding wire. Further, the present invention may be configured such that the varicap diodes and the inductance element 11 are connected in series and they cause series resonance.

In the VCO, the example where the IC and the circuit components are separated is not limited to an example where a frequency in the microwave band is oscillated. Further, when the IC and the circuit components are thus separated, the capacitance element for compensation need not be provided. In the structure where the capacitance element for compensation is provided, the IC and the circuit components need not be separated. For example, the feedback capacitance elements may be included in the IC, or the transistor may be provided outside the IC.

(Experiment 1)

Figure 7:
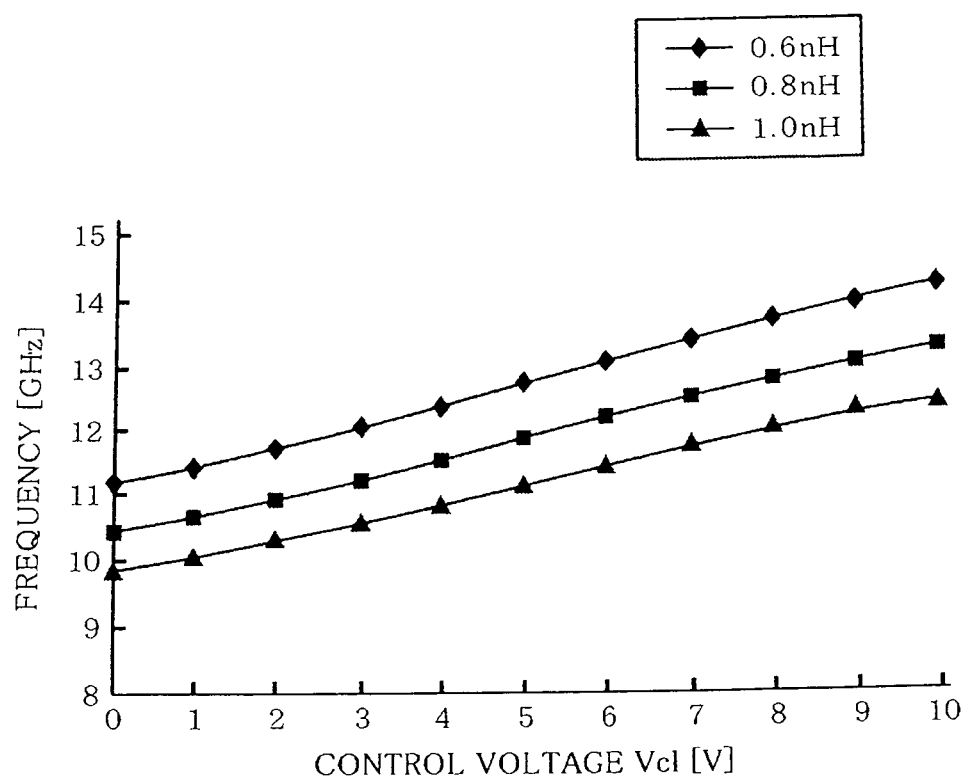
FIG. 7 is a graph diagram showing a correlation between a frequency and a control voltage of the voltage controlled oscillator.
Figure 8:
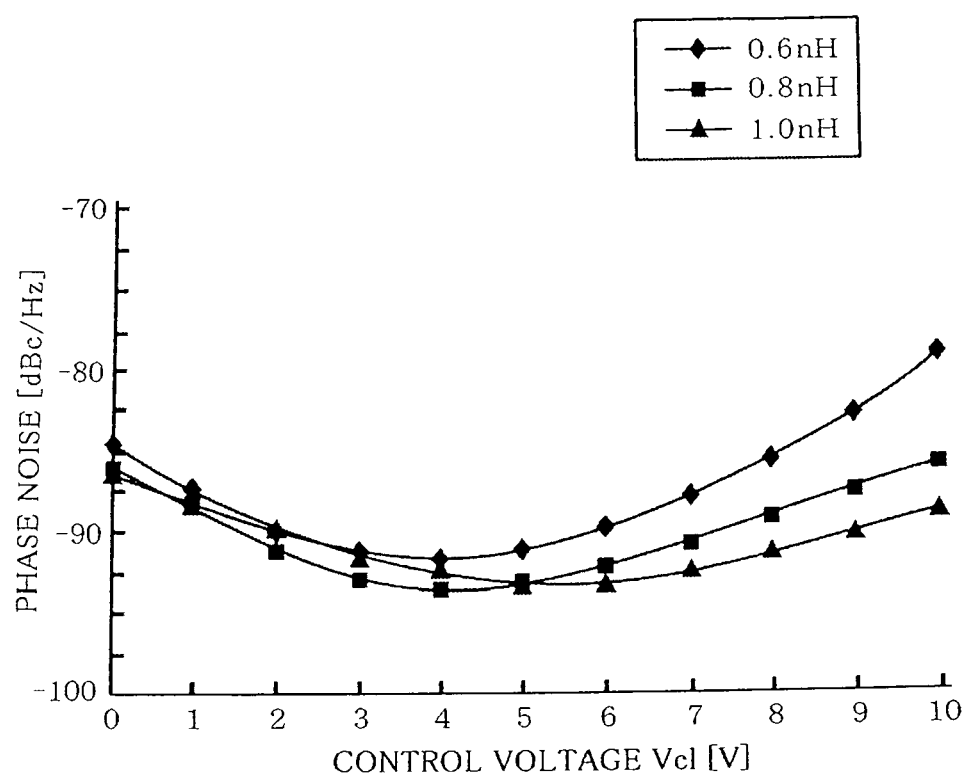
FIG. 8 is a graph diagram showing a correlation between phase noise and the control voltage of the voltage controlled oscillator.

Next, various experiments conducted at a development stage of the VCO of the present invention will be described. As an experiment 1, the circuits of the VCO in FIG. 1 were set by simulation. Then, different control voltages were applied to the input terminals 16 of the respective VCOs, and an oscillation frequency and a phase noise characteristic at a position deviated by 10 kHz from the oscillation frequency were examined for each of the VCOs. In conducting the experiment, 0.6 nH, 0.8 nH, and 1.0 nH were set for the inductance elements 11 respectively. Graphs in FIG. 7 and FIG. 8 show the results of the experiment 1, the horizontal axis of each of the graphs representing a value of the control voltage (unit: V). The vertical axis in FIG. 7 represents the oscillation frequency (unit: GHz) of the VCO, and the vertical axis in FIG. 8 represents the phase noise characteristic (unit: dBc/Hz).

From FIG. 7, it is seen that when the inductance element 11 is changed, the oscillation frequency changes. Further, from FIG. 8, it is seen that, whatever the control voltage is, especially, when the control voltage is lower than 5 V, the phase noise characteristic is reduced to low and good oscillation is exhibited. Therefore, the experiment results show that by changing the inductance element 11 as described above, it is possible to change the oscillation frequency without giving any great influence on the characteristic. This shows that it is effective to form the inductance element 11 as a separate structure from the IC circuit part 3 and select the inductance element 11 according to the oscillation frequency.

(Experiment 2)

Figure 9:
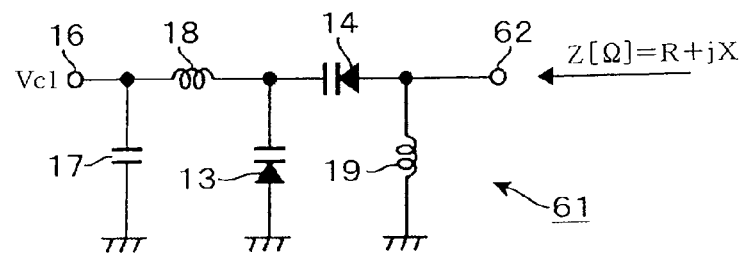
FIG. 9(a) and FIG. 9(b) are a diagram showing a circuit formed for an experiment and a graph showing a correlation between a control voltage and a reactance of the circuit, respectively.
Figure 9:
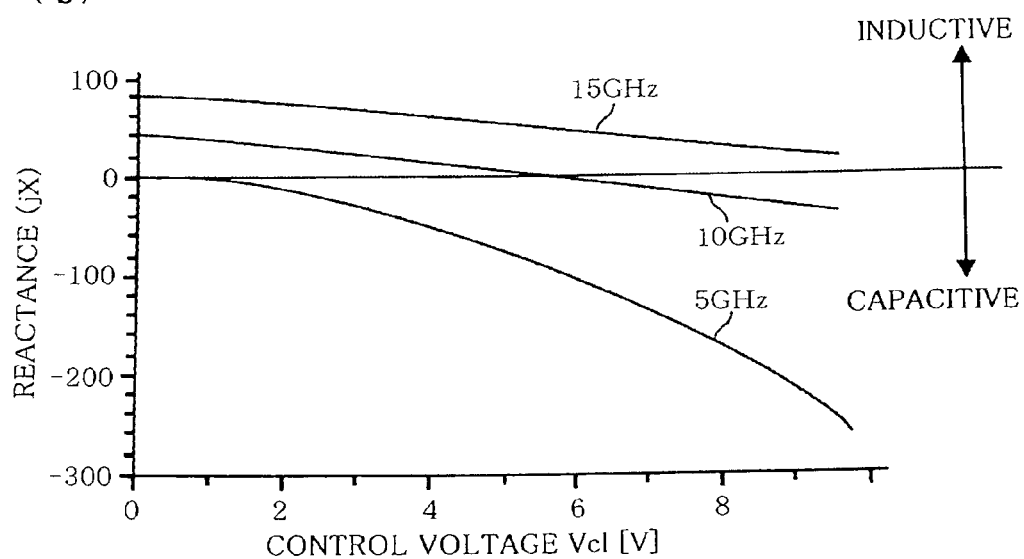

A circuit 61 shown in FIG. 9(*a*) was fabricated. In this circuit 61, circuit elements are connected to one another similarly to those of the front stage side of the aforesaid VCO in FIG. 1, and a rear stage side of a varicap diode 14 and an inductor 19 is connected to an output terminal 62. When a control voltage Vc1 applied to the input terminal 16 for control voltage and a frequency of a signal passing through the circuit 61 were changed and an impedance Z(Ω) between the input terminal 16 and the output terminal 62 was set to Z(Ω) =R+jX, a change in its reactance (jX) was examined.

FIG. 9(*b*) shows the result of the experiment 2, the vertical axis of the graph representing the reactance jX and the horizontal axis representing the control voltage Vc1 (unit: V). In the graph, when the reactance jX is smaller than 0, a portion where the varicap diodes 13, 14 are connected in series in the circuit 61 is capacitive, and when the portion is connected in parallel to the inductance element 11 as in the VCO in FIG. 1, it is possible to cause parallel resonance between this portion and the inductance element 11. When the reactance jX is larger than 0, the portion in which the varicap diodes 13, 14 are connected in series in the circuit 61 is inductive, and when this portion is connected in parallel to the inductance element 11, it is not possible to cause parallel resonance between this portion and the inductance element 11. As shown in the graph, when the oscillation frequency was 5 GHz, the portion where the varicap diodes 13, 14 are connected in series exhibited a capacitive property irrespective of the control voltage Vc1, but when the oscillation frequency was 10 GHz, the series connection portion exhibited a capacitive property when the control voltage Vc1 became large. Further, when the oscillation frequency was 15 GHz, the series connection portion exhibited an inductive property irrespective of the control voltage Vc1.

(Experiment 3)

Figure 10:
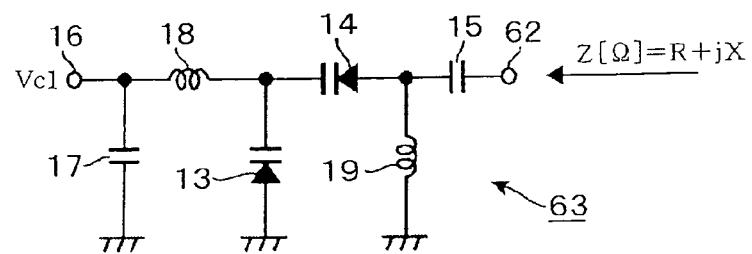
FIG. 10(a) and FIG. 10(b) are a diagram showing a circuit formed for an experiment and a graph showing a correlation between a control voltage and a reactance of the circuit, respectively.
Figure 10:
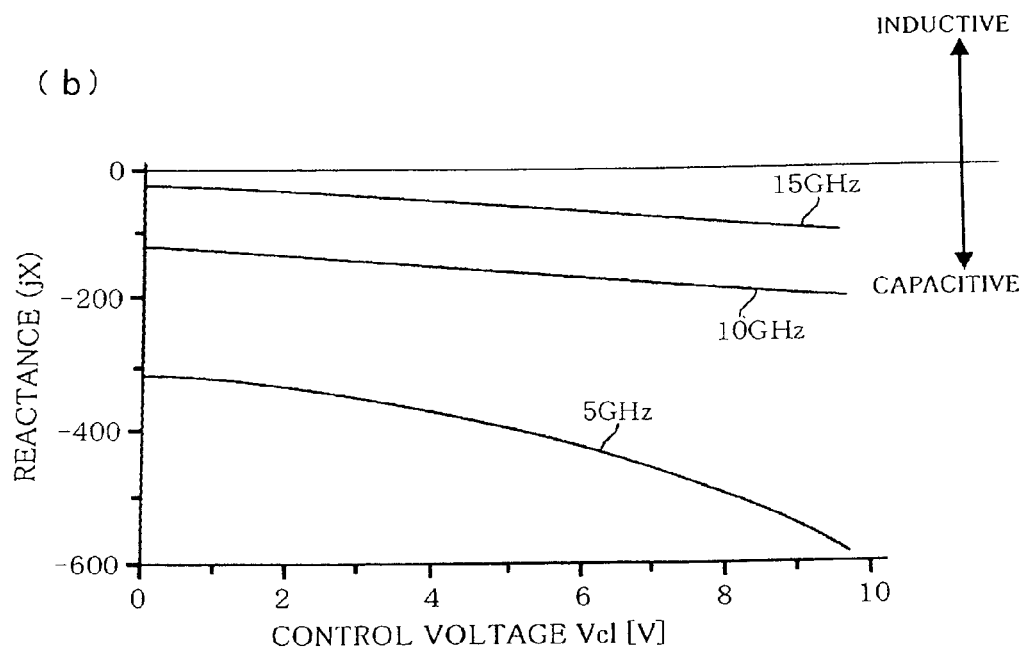

An experiment similar to the experiment 2 was conducted, and in a circuit 63 used in this experiment, the capacitor 15 is connected in series to the varicap diodes 13, 14 on a subsequent stage of the output terminal 62 as shown in FIG. 10(*a*). As a result of the experiment, the reactance jX of the portion where the varicap diodes 13, 14 were connected in series to the capacitor 15 was capacitive irrespective of the control voltage Vc1 at all the oscillation frequencies 5 GHz, 10 GHz, and 15 GHz as shown in FIG. 10(*b*). The experiment 2 and the experiment 3 show that the capacitor 15 need not be provided when a low oscillation frequency is output in the VCO in FIG. 1, but when a high oscillation frequency of, for example, 10 GHz or more is output, it is possible to cause the aforesaid parallel resonance by providing the capacitor 15.

(Experiment 4)

Figure 11:
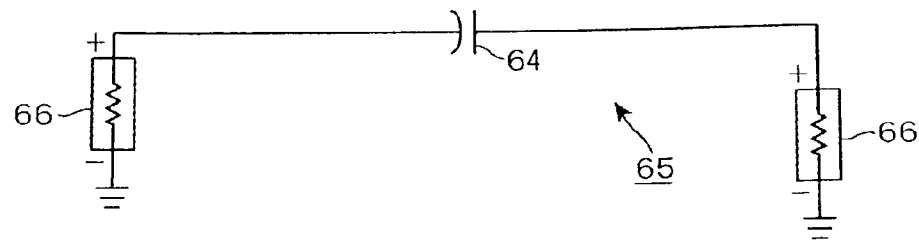
FIG. 11(a) to FIG. 11(c) are a circuit diagram by a simulation and graphs showing an experiment result.
Figure 11:
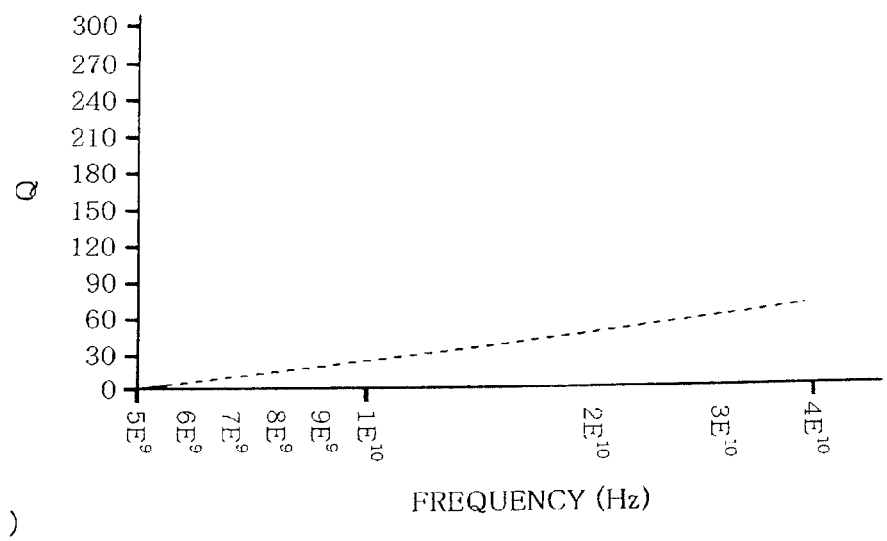
Figure 11:
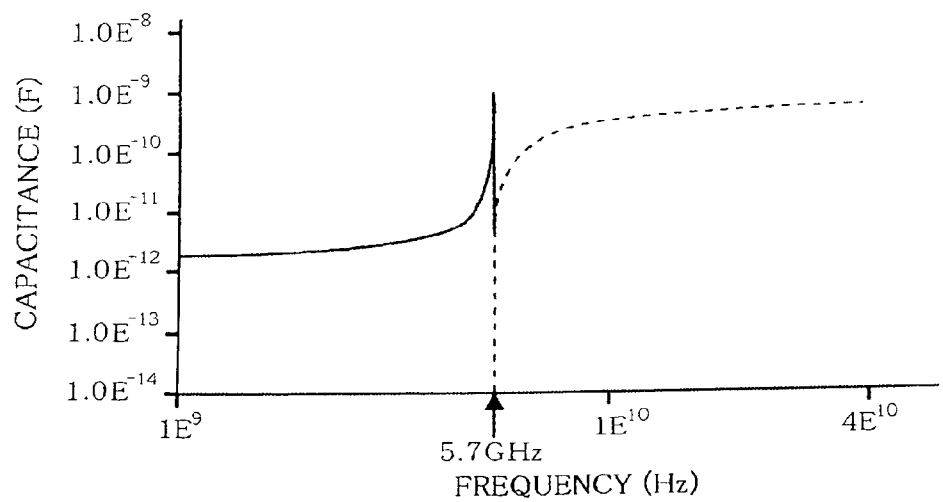

A circuit 65 shown in FIG. 11(*a*) including a capacitor 64 whose lumped constant was 2 pF was formed by a simulation. In FIG. 11(*a*), 66, 66 denote 50Ω resistors. While a frequency flowing in the circuit 65 shown in FIG. 11(*a*) was changed, a capacitance of the capacitor 64 was measured. FIG. 11(*b*) and FIG. 11(*c*) are graphs showing an experiment result, the horizontal axis representing the frequency and the vertical axis representing the capacitance. FIG. 11(*c*) shows a capacitance change near 5.7 GHz in FIG. 11(*b*) in detail. As shown in FIG. 11(*c*), as the frequency increases to approach 5.7 GHz, the capacitance of the capacitor 64 rapidly increases and thereafter rapidly reduces. Then, when the frequency is 5.7 GHz or higher, the capacitor 64 functions as an inductor. That is, the capacitor 64 has a cutoff in a 5.7 GHz band. Incidentally, when the frequency is larger than the cutoff, a unit of the vertical axis of the graph should be henry (H) but this unit is omitted in FIG. 11(*b*) and FIG. 11(*c*). Further, in FIG. 11(*b*) and FIG. 11(*c*), a graph line when the capacitor 64 has the capacitive property is shown by a solid line, and a graph line when it has the inductive property is shown by a dotted line. In later-described graphs each showing a cutoff of an element which exhibits a capacitive property or an inductive property depending on the frequency, a graph line when the element exhibits the capacitive property is shown by a solid line and a graph line when it exhibits the inductive property is shown by a dotted line as well.

(Experiment 5)

Figure 12:
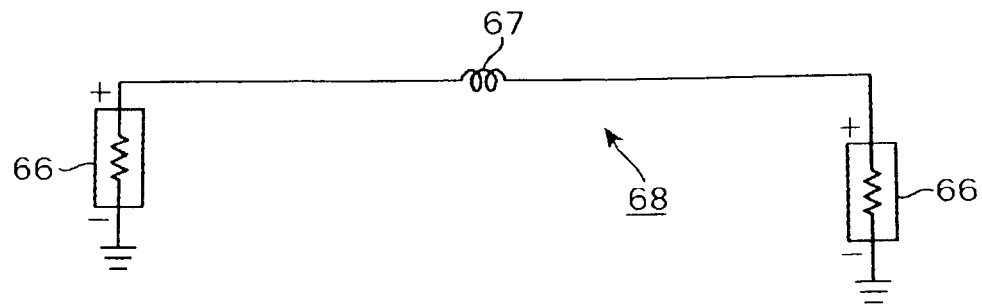
FIG. 12(a) to FIG. 12(c) are a circuit diagram by a simulation and graphs showing an experiment result.
Figure 12:
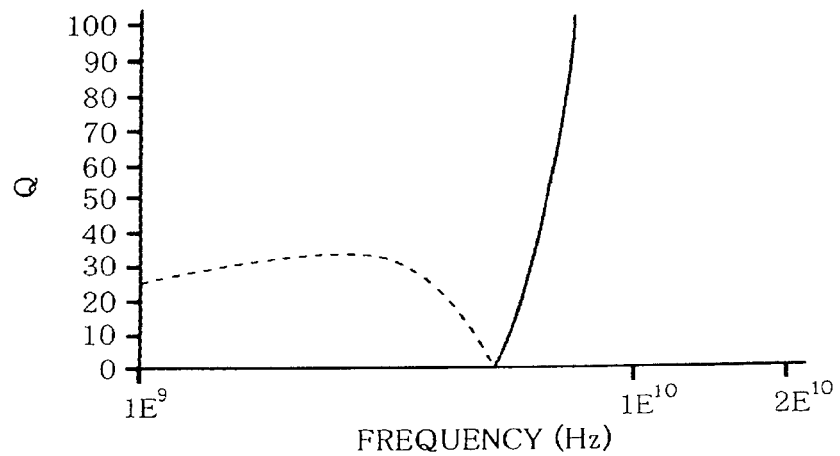
Figure 12:
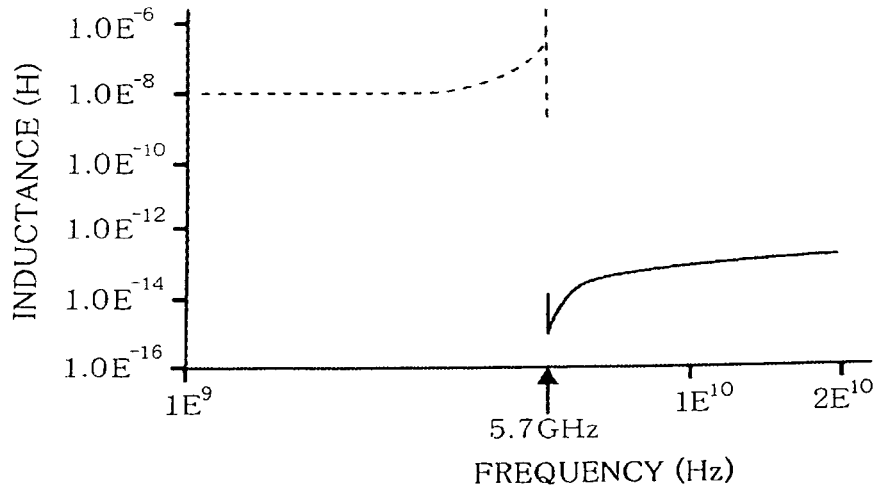

A circuit 68 including an inductor 67 whose lumped constant was 10 nH was formed by a simulation as shown in FIG. 12(*a*). Then, while a frequency flowing in the circuit 68 in FIG. 12(*a*) was changed, an inductance of the inductor 67 was measured. FIG. 12(*b*) and FIG. 12(*c*) are graphs showing an experiment result, the horizontal axis representing the frequency and the vertical axis representing the inductance. FIG. 12(*c*) shows a change in the inductance near 5.7 GHz in FIG. 12(*b*) in detail. As shown in the graph in FIG. 12(*c*), when the frequency increases to approach 5.7 GHz, the inductance increases but when the frequency reaches 5.7 GHz, the inductance rapidly reduces. Then, when the frequency is 5.7 GHz or more, the inductor 67 functions as a capacitor. That is, the inductor 67 has a cutoff in a 5.7 GHz band. Incidentally, a unit of the vertical axis of the graph should be farad (F) when the frequency is larger than the cutoff, but this unit is omitted in FIG. 12(*b*) and FIG. 12(*c*).

(Experiment 6)

Figure 5:
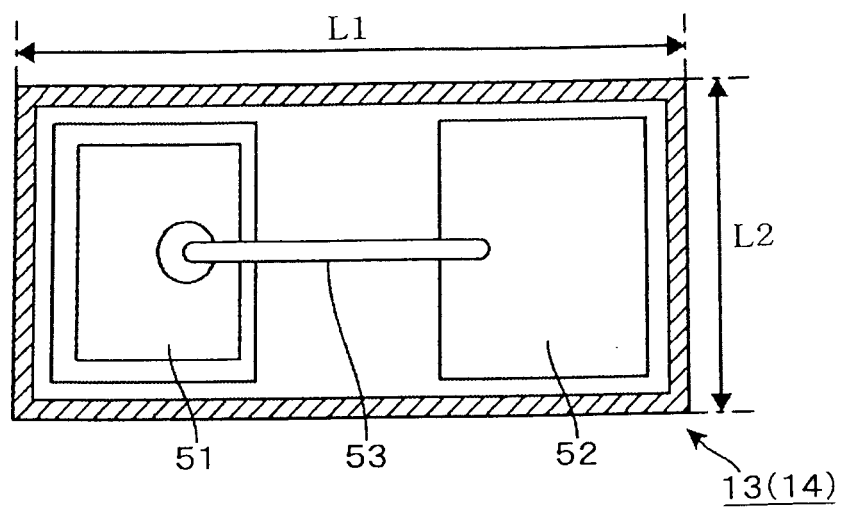
FIG. 5(a) and FIG. 5(b) are a horizontal plane view and a vertical sectional view of a varicap diode respectively.
Figure 5:
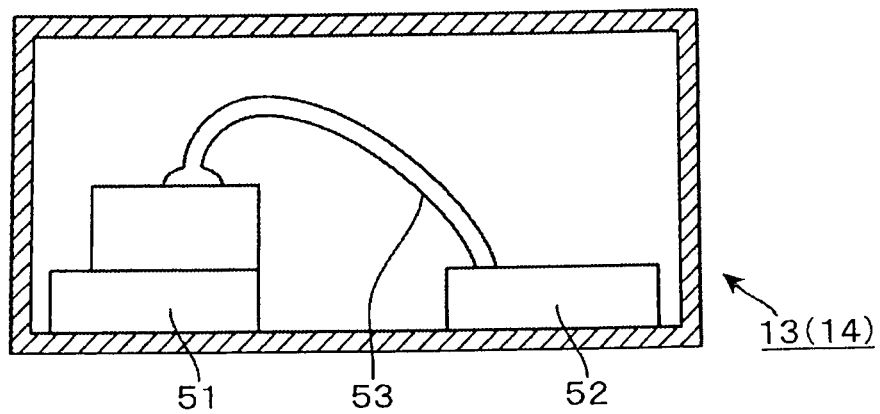
Figure 13:
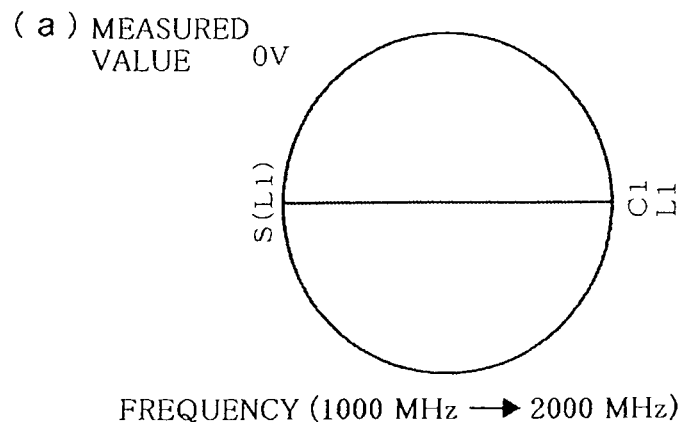
FIG. 13(a) to FIG. 13(c) are a circuit diagram by a simulation and graphs showing experiment results.
Figure 13:
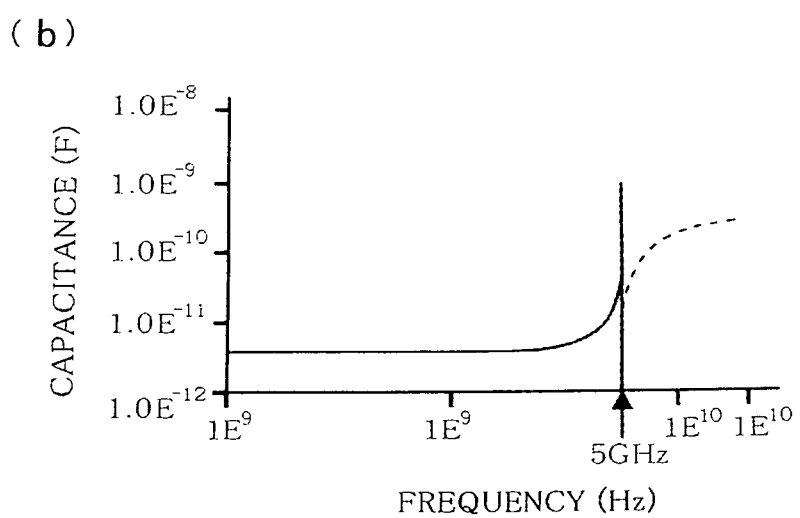
Figure 13:
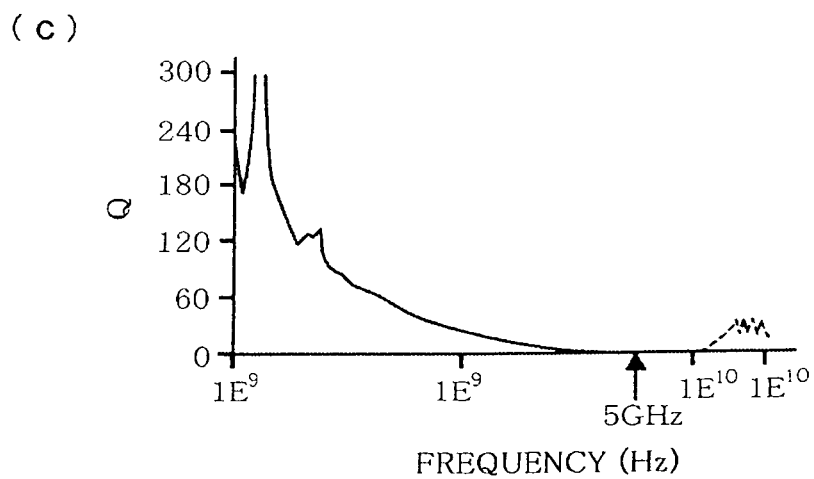

Next, regarding the varicap diode 14 shown in FIG. 5(*a*) and FIG. 5(*b*), frequency-dependent changes of capacitance and inductance were measured. A length L1 and a width L2, shown in FIG. 5(*a*), of the varicap diode 14 are 0.6 mm and 0.3 mm respectively. FIG. 13(*a*) is a Smith chart of the varicap diode 14 obtained by the measurement. In FIG. 13(*b*), the horizontal axis represents a frequency of a signal supplied to the varicap diode 14 and the vertical axis represents a capacitance of the varicap diode 14. In FIG. 13(*c*), the horizontal axis represents the frequency and the vertical axis represents the inductance of the varicap diode 14. As shown in FIG. 13(*b*), a cutoff is present near 5 GHz, and when the frequency is higher than the cutoff, an inductive property is exhibited. Incidentally, in FIG. 13(*b*) similarly to FIG. 11(*c*), when the frequency is higher than the cutoff, a change in the inductance is shown, and a unit of the vertical axis should be henry at the aforesaid frequencies, but this unit is omitted in FIG. 13(*b*) and FIG. 13(*c*).

The experiments 4, 5 show that when the oscillation frequency of the VCO becomes high, the cutoff appears in the capacitor and the inductor. The experiment 6 shows that the cutoff appears also in the varicap diode as described above, which makes it clear that when the frequency becomes high, the capacitive property of the varicap diode cannot be maintained as described in FIG. 4(*a*) to FIG. 4(*d*).

(Experiment 7)

Figure 14:
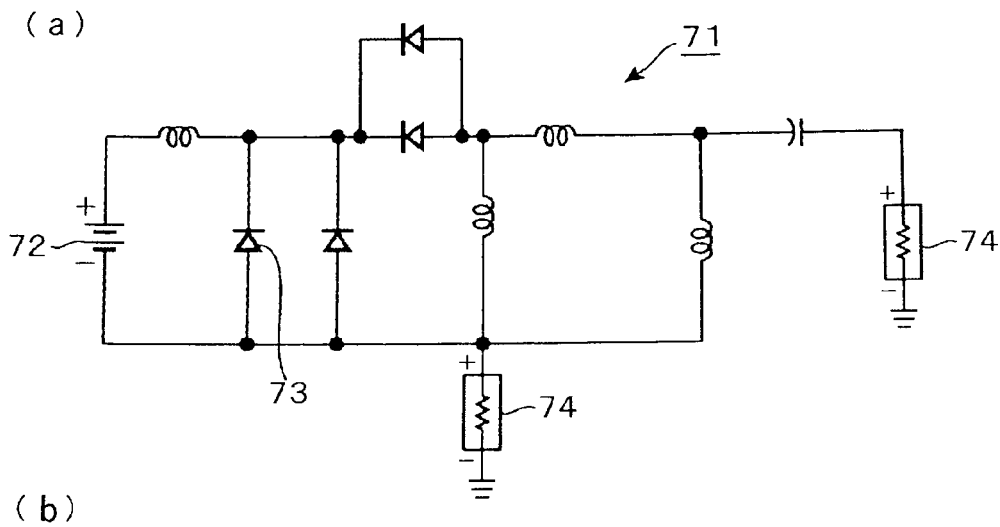
FIG. 14(a) to FIG. 14(c) are a circuit diagram by a simulation and graphs showing experiment results.
Figure 14:
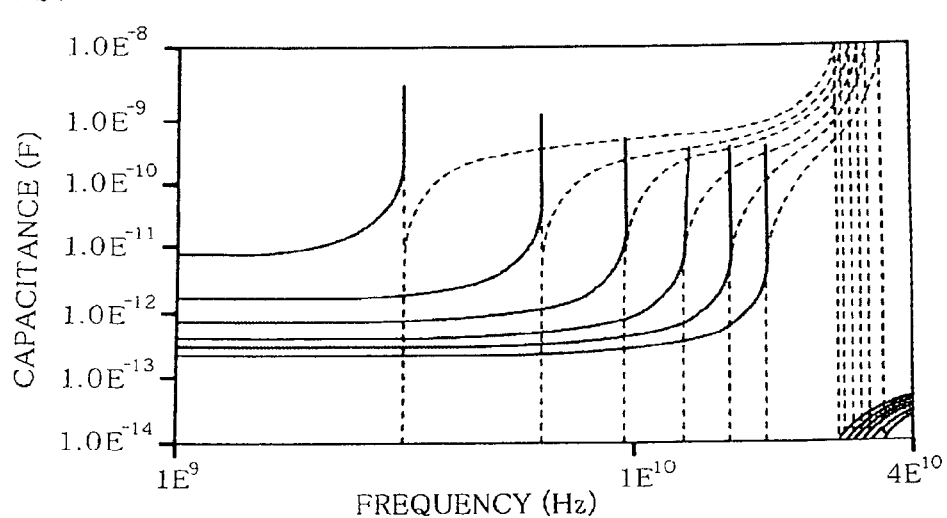
Figure 14:
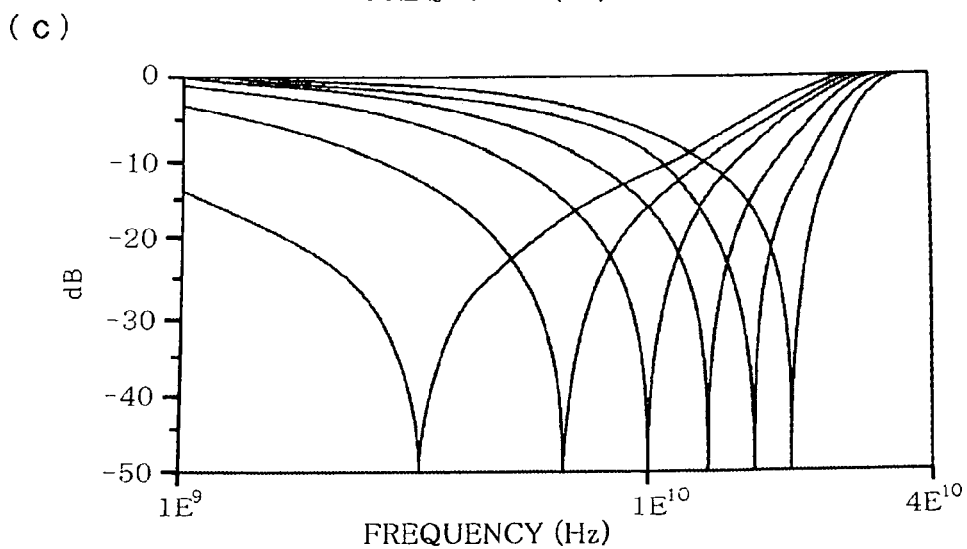

A circuit 71 shown in FIG. 14(*a*) was set by a simulation. Then, a voltage of a DC power source 72 in FIG. 14(*a*) was changed within a range from 0 V to 10 V, and a cutoff frequency of a varicap diode 73 in FIG. 14(*a*) and a noise characteristic were examined. An inductance of the inductor 73 in FIG. 14(*a*) is 10 nH and resistors 74, 74 are set to 50Ω. Similarly to FIG. 13(*b*), FIG. 14(*b*) is a graph showing a correlation between a capacitance of the varicap diode 73 and an oscillation frequency flowing in the circuit. FIG. 14(*c*) is a graph showing a correlation between phase noise and the frequency, the frequency and noise (unit dB) being taken on the horizontal axis and the vertical axis respectively. As shown in FIG. 14(*b*), a cutoff appears between $1E^9$ to $1E^{10}$ Hz depending on a set value of the voltage. As shown in FIG. 14(*c*), at the frequency where the cutoff appears, the noise characteristic deteriorates.

(Experiment 8)

Figure 15:
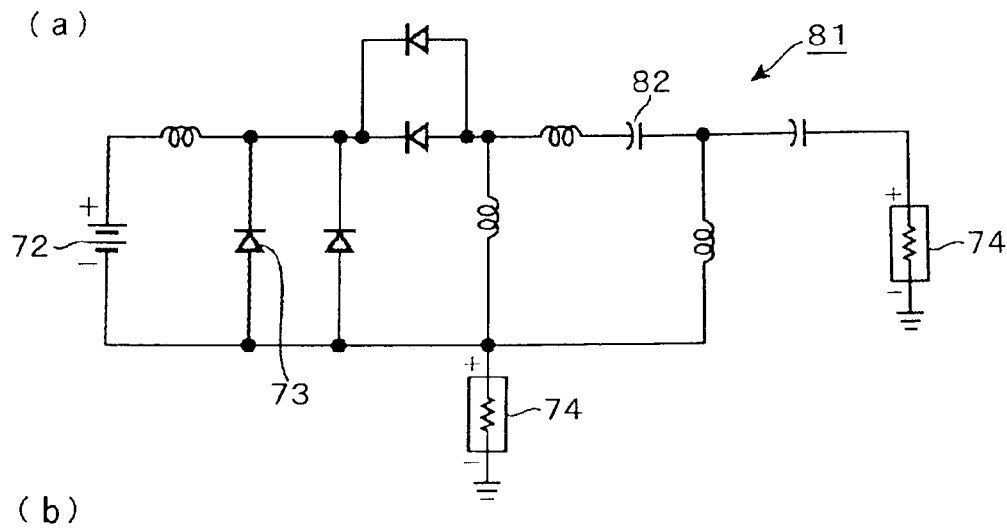
FIG. 15(a) to FIG. 15(c) are a circuit diagram by a simulation and graphs showing experiment results.
Figure 15:
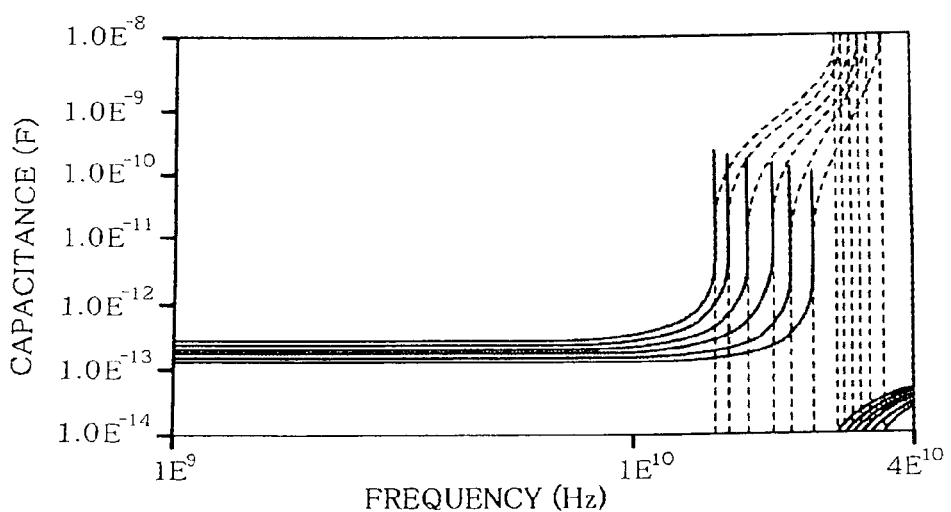
Figure 15:
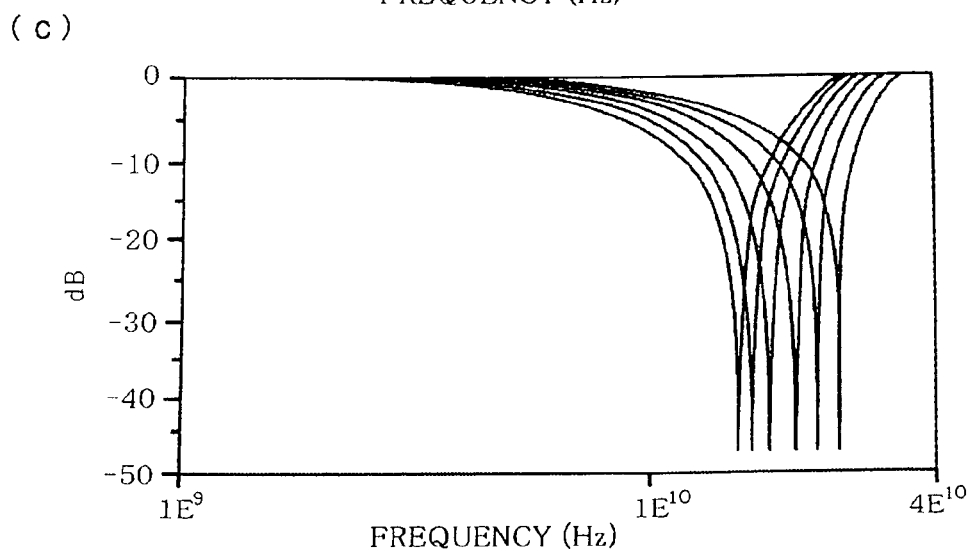

As an experiment 8, a circuit 81 shown in FIG. 15(*a*) was set by a simulation. This circuit 81 has the same structure as that of the circuit 71 in FIG. 14(*a*) except that a 0.2 pF capacitor 82 is connected in series to the varicap diode 73. Regarding this circuit 81, a cutoff of the varicap diode 73 and a phase noise characteristic were examined similarly to the experiment 7. FIG. 15(*b*) similarly to FIG. 14(*b*) is a graph showing a correlation between a capacitance of the varicap diode 73 and an oscillation frequency flowing in the circuit, and FIG. 15(*c*) similarly to FIG. 14(*c*) is a graph showing a correlation between phase noise and the frequency. As shown in FIG. 15(*b*), the cutoff appears in a frequency band higher than $1E^{10}$ Hz, and accordingly, a peak of the deterioration of the noise characteristic also appears in a band of $1E^{10}$ Hz or higher as shown in FIG. 15(*c*). The experiments 7, 8 show that by connecting the capacitor in series to the varicap diode, it is possible to compensate for the inductive property of the varicap diode caused by a high frequency and ensure the capacitive property of the varicap diode. Therefore, the aforesaid effect of the capacitor 15 described in FIG. 4(*a*) to FIG. 6 was proved.

(Experiment 9)

Figure 16:
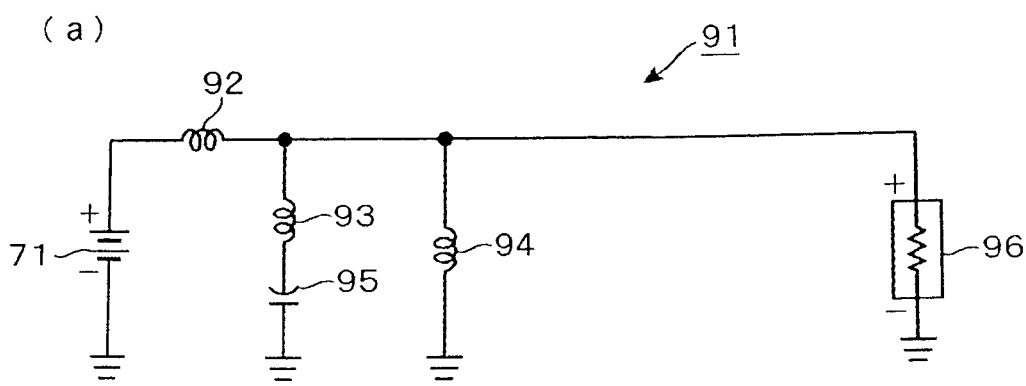
FIG. 16(a) and FIG. 16(b) are a circuit diagram by a simulation and a graph showing an experiment result.
Figure 16:
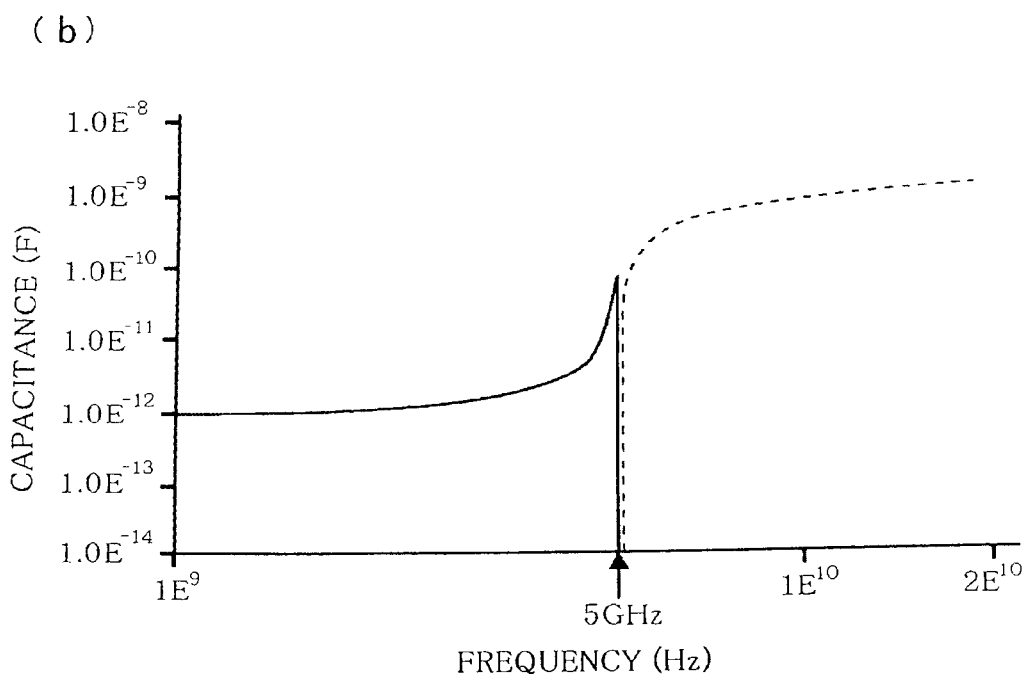

A circuit 91 shown in FIG. 16(*a*) was set by a simulation. A voltage of a DC power source 71 is 1 V and inductances of inductors 92, 93, 94 are 100 mH, 1 nH, and 100 mHz respectively. A capacitance of a capacitor 95 is set to 1 pF and a resistor 96 is set to 50Ω. The capacitance of the capacitor 95 when a frequency of a signal supplied to the circuit 91 was changed was examined. FIG. 16(*b*) is a graph showing an experiment result, and similarly to FIG. 11(*c*) and FIG. 13(*b*), in a frequency band lower than a cutoff, a capacitance change is shown, and in a frequency band higher than the cutoff, a change in inductance is shown. The cutoff appeared at 5 GHz.

(Experiment 10)

Figure 17:
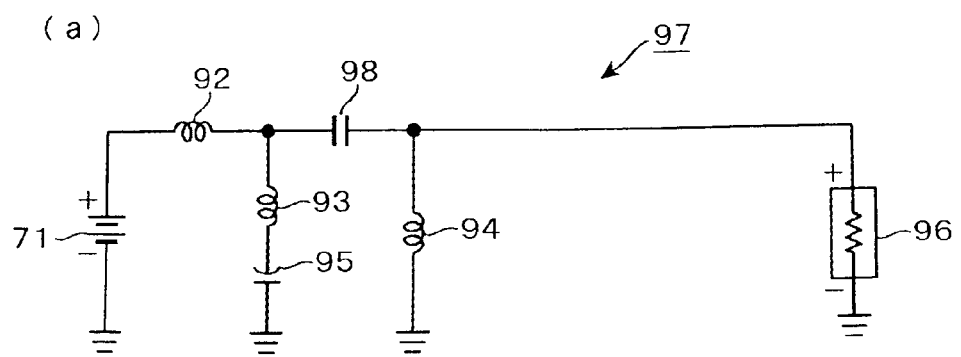
FIG. 17(a) and FIG. 17(b) are a circuit diagram by a simulation and a graph showing an experiment result.
Figure 17:
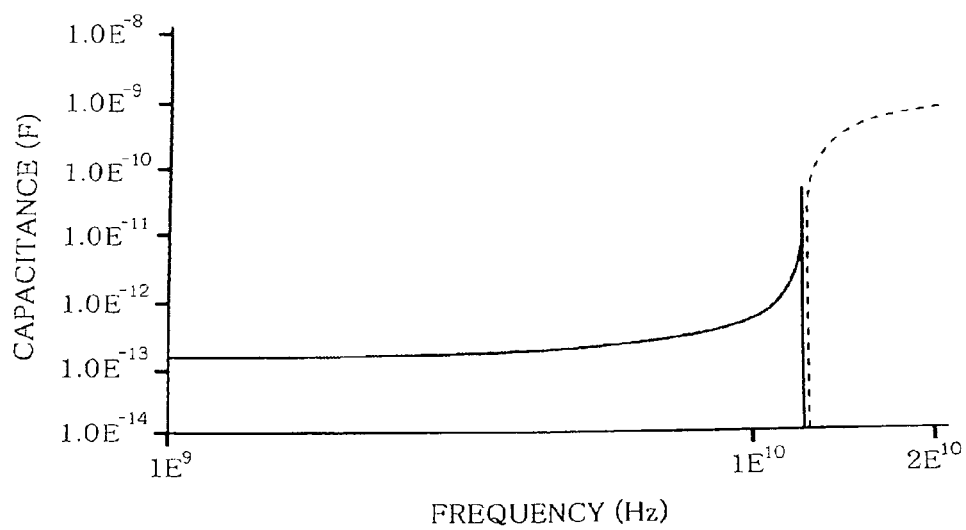

A circuit 97 shown in FIG. 17(*a*) was set by a simulation. This circuit 97 is structured such that a 0.2 pF capacitor 98 is added to the circuit 91 in FIG. 16(*a*). An experiment similar to the experiment 9 was conducted by using this circuit 97. FIG. 17(*b*) similarly to FIG. 16(*b*) shows an experiment result. Here, a resultant capacitance of the capacitors 95, 98 is 0.2 pF×1 pF/(0.2 pF+1 pF)=0.167 pF. A cutoff frequency is 1/(2× pi×√(1 nH×0.167 pF))=12.328 GHz. Thus, the resultant capacitance of the capacitors 95, 98 is lower than the individual capacitance of each of the capacitors 95, 98. As is seen from the above equation and the graph in FIG. 16(*b*), as a result of adding the capacitor 98, the cutoff frequency is made larger compared with that of the circuit 91. Therefore, the results of the experiments 9, 10 also show that by connecting the capacitor 15 in series to the varicap diodes 13, 14 in the VCO in FIG. 1, it is possible to compensate for the inductive properties of the varicap diodes 13, 14, shift the cutoff toward a higher frequency side, and ensure the capacitive properties of the varicap diodes 13, 14.

(Experiment 11)

Figure 18:
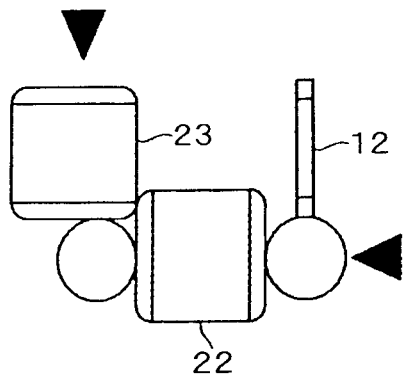
FIG. 18(a) and FIG. 18(b) are an explanatory view showing a measuring part and a graph showing a measurement result.
Figure 18:
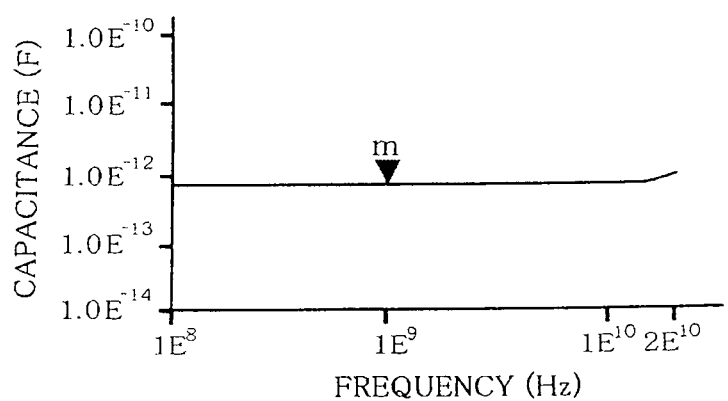

As an experiment 11, a characteristic of the capacitors 22, 23 provided on the quartz-crystal substrate 41 as shown in FIG. 18(*a*) was examined. FIG. 18(*b*) shows a measurement result. The horizontal axis of the graph represents a frequency of a signal supplied to the capacitors 22, 23 and the vertical axis represents a resultant capacitance of the capacitors 22, 23. As shown in the graph, it is seen that even when the frequency becomes high, the cutoff does not appear and the normal operation is conducted. The frequency at the point shown in the graph was 1.0 GHz, and the resultant capacitance at this time was $6.742 \text{ E}^{-13}$ F.

What is claimed is:

1. A voltage controlled oscillator comprising:
   a resonance part including a variable capacitance element and an inductance element, the variable capacitance element having a capacitance that varies according to a control voltage for frequency control input from an external part, and a series resonant frequency of the resonance part being adjusted according to the capacitance;
   an amplifying part amplifying a frequency signal from said resonance part; and
   a feedback part including a capacitance element for feedback, and feeding the frequency signal amplified by said amplifying part back to said resonance part to form an oscillation loop together with said amplifying part and said resonance part; and
   wherein said amplifying part is provided in an integrated circuit chip, and said resonance part and the capacitance element for feedback are formed as circuit components separate from the integrated circuit chip wherein the integrated circuit chip and the circuit components are mounted on a substrate, wherein the inductance element of said resonance part is a conductive path formed on a quartz-crystal substrate;

wherein in said resonance part, a capacitance element for compensation is connected in series to the variable capacitance element in order to compensate for an inductive property of the variable capacitance element caused by a high frequency to make the variable capacitance element capacitive when seen from the inductance element;

wherein the variable capacitance element, the capacitance element for compensation, and the inductance element are connected in order;

wherein relative to the amplifying part, the variable capacitance element and the capacitance element for compensation are connected in parallel to the inductance element; and wherein the capacitance element for compensation is made up of a pair of comb-like conductive paths whose teeth are alternately arranged at a spaced interval formed on the plane of the quartz-crystal substrate.

2. A voltage controlled oscillator comprising:

a resonance part including a variable capacitance element and an inductance element, the variable capacitance element having a capacitance that varies according to a control voltage for frequency control input from an external part, and a series resonant frequency art being adjusted according to the capacitance;

an amplifying part amplifying a frequency signal from said resonance part; and a feedback part including a capacitance element for feedback, and feeding the frequency signal amplified by said amplifying part back to said resonance part to form an oscillation loop together with said amplifying part and said resonance part; and wherein said amplifying part is provided in an integrated circuit chip, and said resonance part and the capacitance element for feedback are formed as circuit components separate from the integrated circuit chip, wherein the integrated circuit chip and the circuit components are mounted on a substrate;

wherein in said resonance part, for compensation is connected in series to the variable capacitance element in order to compensate for an inductive property of the variable capacitance element caused by a high frequency to make the variable capacitance element capacitive when seen from the inductance element;

wherein the variable capacitance element, the capacitance element for compensation, and the inductance element are connected in this order;

wherein seen from the amplifying part, the variable capacitance element and the capacitance element for compensation are connected in parallel to the inductance element; and wherein the capacitance element for compensation is made up of a pair of comb-like conductive paths whose teeth are alternately arranged at a spaced interval formed on the plane of a quartz-crystal substrate.

3. The voltage controlled oscillator of claim 1 wherein the series resonant frequency is 5 GHz or more.

4. A voltage controlled oscillator comprising:

a resonance part including a variable capacitance element and an inductance element, the variable capacitance element having a capacitance that varies according to a control voltage for frequency control input from an external part, and a series resonant frequency of the resonance part being adjusted according to the capacitance;

an amplifying part amplifying a frequency signal from said resonance part; and a feedback part including a capacitance element for feedback and feeding the frequency signal amplified by said amplifying part back to said resonance part to form an oscillation loop together with said amplifying part and said resonance part; and wherein in said resonance part, a capacitance element for compensation is connected in series to the variable capacitance element in order to compensate for an inductive property of the variable capacitance element caused by a high frequency to make the variable capacitance element capacitive when seen from the inductance element;

wherein the variable capacitance element, the capacitance element for compensation, and the inductance element are connected in this order;

wherein seen from the amplifying part, the variable capacitance element and the capacitance element for compensation are connected in parallel to the inductance element; and wherein the inductance element of said resonance part is a conductive path formed on a quartz-crystal substrate, and wherein the capacitance element for compensation is made up of a pair of comb-like conductive paths whose teeth are alternately arranged at a spaced interval formed on the plane of the quartz-crystal substrate.

5. A voltage controlled oscillator comprising:

a resonance part including a variable capacitance element and an inductance element, the variable capacitance element having a capacitance that varies according to a control voltage for frequency control input from an external part, and a series resonant frequency of the resonance part being adjusted according to the capacitance;

an amplifying part amplifying a frequency signal from said resonance part; and a feedback part including a capacitance element for feedback and feeding the frequency signal amplified by said amplifying part back to said resonance part to form an oscillation loop together with said amplifying part and said resonance part; and wherein in said resonance part, a capacitance element for compensation is connected in series to the variable capacitance element in order to compensate for an inductive property of the variable capacitance element caused by a high frequency to make the variable capacitance element capacitive when seen from the inductance element;

wherein the variable capacitance element, the capacitance element for compensation, and the inductance element are connected in this order;

wherein seen from the amplifying part, the variable capacitance element and the capacitance element for compensation are connected in parallel to the inductance element; and wherein the capacitance element for compensation is made up of a pair of comb-like conductive paths whose teeth are alternately arranged at a spaced interval formed on the plane of the quartz-crystal substrate.

6. The voltage controlled oscillator of claim 2, wherein the series resonant frequency is 5 GHz or more.

7. The voltage controlled oscillator of claim 4, wherein the series resonant frequency is 5 GHz or more.

8. The voltage controlled oscillator of claim 5, wherein the series resonant frequency is 5 GHz or more.

9. A voltage controlled oscillator comprising:
a resonance part including a variable capacitance element and an inductance element, the variable capacitance element having a capacitance that varies according to a control voltage for frequency control input from an external part, and a series resonant frequency of the resonance part being adjusted according to the capacitance;
an amplifying part amplifying a frequency signal from said resonance part; and
a feedback part including a capacitance element for feedback, and feeding the frequency signal amplified by said amplifying part back to said resonance part to form an oscillation loop together with said amplifying part and said resonance part; and
wherein said amplifying part is provided in an integrated circuit chip, and said resonance part and the capacitance element for feedback are formed as circuit components separate from the integrated circuit chip, wherein the integrated circuit chip and the circuit components are mounted on a substrate;
wherein in said resonance part, a capacitance element for compensation is connected in series to the variable capacitance element in order to compensate for an inductive property of the variable capacitance element caused by a high frequency to make the variable capacitance element capacitive when seen from the inductance element;
wherein the capacitance element for compensation and the inductance element are formed on a quartz-crystal substrate; and
wherein the variable capacitance element is mounted on a dielectric substrate.

10. A voltage controlled oscillator comprising:
a resonance part including a variable capacitance element and an inductance element, the variable capacitance element having a capacitance that varies according to a control voltage for frequency control input from an external part, and a series resonant frequency of the resonance part being adjusted according to the capacitance;
an amplifying part amplifying a frequency signal from said resonance part; and
a feedback part including a capacitance element for feedback and feeding the frequency signal amplified by said amplifying part back to said resonance part to form an oscillation loop together with said amplifying part and said resonance part; and
wherein in said resonance part, a capacitance element is made up of a pair of conductive paths for compensation formed on a quartz-crystal substrate is connected in series to the variable capacitance element in order to compensate for an inductive property of the variable capacitance element caused by a high frequency to make the variable capacitance element capacitive when seen from the inductance element;
wherein the capacitance element for compensation and the inductance element are formed on a quartz-crystal substrate; and
wherein the variable capacitance element is mounted on a dielectric substrate.

11. The voltage controlled oscillator of claim 2, wherein the variable capacitance element is mounted on a dielectric substrate.

12. The voltage controlled oscillator of claim 5, wherein the variable capacitance element is mounted on a dielectric substrate.

13. The voltage controlled oscillator of claim 9, wherein the capacitance element for compensation is made up of a pair of comb-like conductive paths whose teeth are alternately arranged at a spaced interval formed on the plane of the quartz-crystal substrate.

14. The voltage controlled oscillator of claim 10, wherein the capacitance element for compensation is made up of a pair of comb-like conductive paths whose teeth are alternately arranged at a spaced interval formed on the plane of the quartz-crystal substrate.

* * * * *

UNITED STATES PATENT AND TRADEMARK OFFICE
CERTIFICATE OF CORRECTION

| | |
|---|---|
| PATENT NO. | : 8,547,183 B2 |
| APPLICATION NO. | : 12/924515 |
| DATED | : October 1, 2013 |
| INVENTOR(S) | : Junichiro Yamakawa et al. |

It is certified that error appears in the above-identified patent and that said Letters Patent is hereby corrected as shown below:

In the Claims

At claim 2, column 11, line 29, "a series resonant frequency art being" should read --a series resonant frequency of the resonance part being--.

Signed and Sealed this
Twenty-fifth Day of March, 2014

Michelle K. Lee
*Deputy Director of the United States Patent and Trademark Office*